(12) United States Patent
Roy et al.

(10) Patent No.: US 10,056,901 B2
(45) Date of Patent: Aug. 21, 2018

(54) IMPEDANCE CONTROL IN RADIO-FREQUENCY SWITCHES

(71) Applicant: SKYWORKS SOLUTIONS, INC., Woburn, MA (US)

(72) Inventors: Ambarish Roy, Waltham, MA (US); Guillaume Alexandre Blin, Carlisle, MA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 15/429,973

(22) Filed: Feb. 10, 2017

(65) Prior Publication Data

US 2017/0237432 A1 Aug. 17, 2017

Related U.S. Application Data

(60) Provisional application No. 62/294,245, filed on Feb. 11, 2016.

(51) Int. Cl.
*H03K 19/00* (2006.01)
*H03K 17/693* (2006.01)

(52) U.S. Cl.
CPC ....... *H03K 19/0005* (2013.01); *H03K 17/693* (2013.01); *H03K 2217/0036* (2013.01)

(58) Field of Classification Search
CPC ....... H03K 19/0005; H03K 2217/0054; H03K 3/356052; H03K 3/356147; H03K 17/693
See application file for complete search history.

(56) References Cited

U.S. PATENT DOCUMENTS

| | | | | |
|---|---|---|---|---|
| 9,356,144 | B1* | 5/2016 | Mason | H01L 27/0255 |
| 2007/0069291 | A1* | 3/2007 | Stuber | H01L 27/1203 257/347 |
| 2012/0267719 | A1* | 10/2012 | Brindle | H01L 29/78609 257/348 |
| 2013/0015717 | A1* | 1/2013 | Dykstra | H03K 17/005 307/100 |
| 2014/0009205 | A1* | 1/2014 | Madan | H03K 17/162 327/379 |
| 2014/0009206 | A1* | 1/2014 | Madan | H03K 17/162 327/379 |
| 2014/0009210 | A1* | 1/2014 | Madan | H03K 17/161 327/427 |
| 2014/0009212 | A1* | 1/2014 | Altunkilic | H03K 17/08104 327/427 |
| 2014/0009213 | A1* | 1/2014 | Sprinkle | H03K 17/161 327/427 |
| 2014/0009214 | A1* | 1/2014 | Altunkilic | H03K 17/161 327/427 |

(Continued)

*Primary Examiner* — Jason M Crawford
(74) *Attorney, Agent, or Firm* — Chang & Hale LLP

(57) ABSTRACT

A radio-frequency switch includes a first field-effect transistor disposed between a first node and a second node, the first field-effect transistor having a source, a drain, a gate, and a body. The switch further includes a coupling path connected between the body of the first field-effect transistor and the gate of the first field-effect transistor, the coupling path including a diode. The switch further includes an adjustable impedance network connected between the body of the first field-effect transistor and a ground reference, the adjustable impedance network being configured to reduce radio-frequency distortion in the first field-effect transistor.

17 Claims, 13 Drawing Sheets

(56) References Cited

U.S. PATENT DOCUMENTS

| | | | |
|---|---|---|---|
| 2015/0341026 A1* | 11/2015 | de Jongh | H03K 17/161 327/382 |
| 2015/0381171 A1* | 12/2015 | Cebi | H03K 17/687 327/427 |
| 2016/0285449 A1* | 9/2016 | Yoo | H03K 17/693 |

* cited by examiner

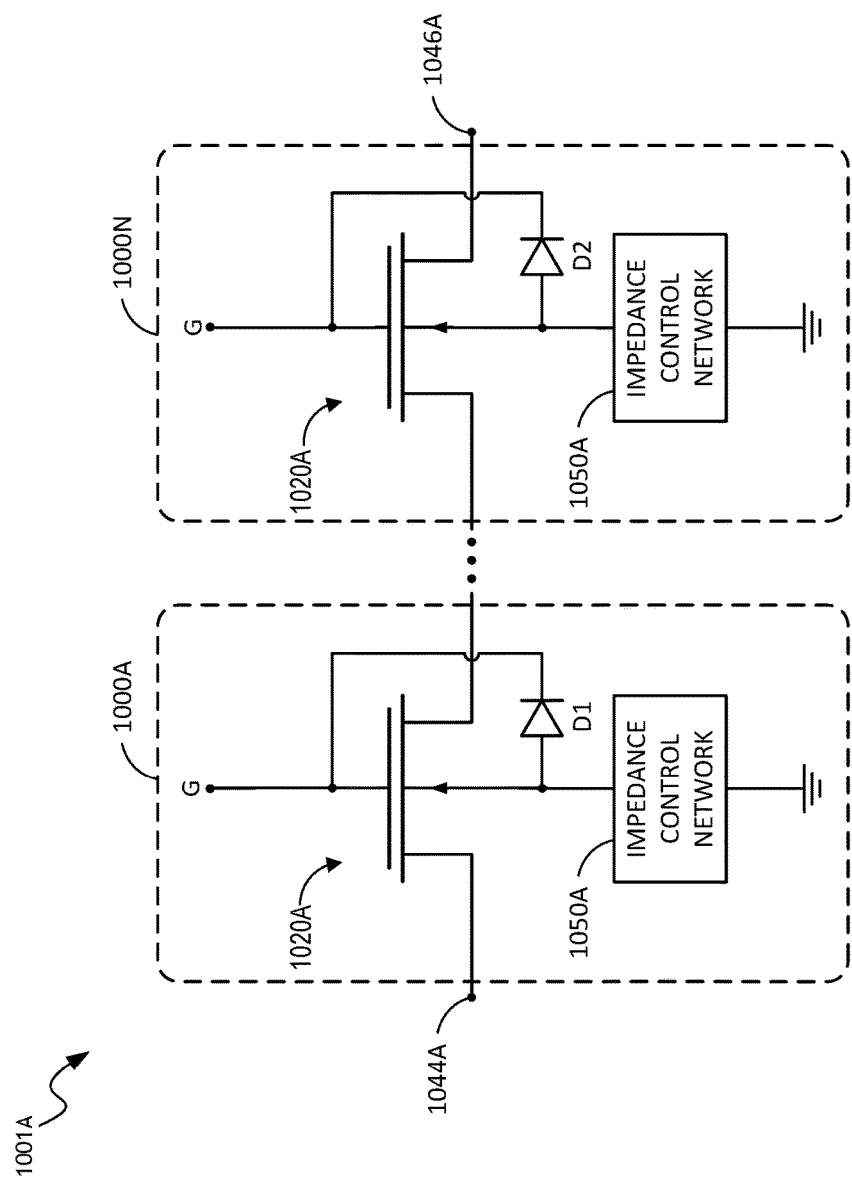

IMPEDANCE CONTROL IN RADIO-FREQUENCY SWITCHES

CROSS-REFERENCE TO RELATED APPLICATION(S)

This application claims priority to U.S. Provisional Application No. 62/294,245, filed Feb. 11, 2016, and entitled BIAS AND IMPEDANCE CONTROL IN RADIO-FREQUENCY SWITCHES, the disclosure of which is hereby incorporated by reference in its entirety.

BACKGROUND

Field

The present disclosure relates to field-effect transistor (FET) devices such as silicon-on-insulator (SOI) devices.

Description of the Related Art

In electronics applications, field-effect transistors (FETs) can be utilized as switches. Such switches can allow, for example, routing of radio-frequency (RF) signals in wireless devices.

SUMMARY

In accordance with a number of implementations, the present disclosure relates to a radio-frequency switch comprising a first field-effect transistor disposed between a first node and a second node, the first field-effect transistor having a source, a drain, a gate, and a body. The radio-frequency switch further comprises a coupling path connected between the body of the first field-effect transistor and the gate of the first field-effect transistor, the coupling path including a diode, and an adjustable impedance network connected between the body of the first field-effect transistor and a ground reference, the adjustable impedance network being configured to reduce radio-frequency distortion in the first field-effect transistor.

The adjustable impedance network is configured to present a first impedance when the first field-effect transistor is transmitting a signal having a first frequency and present a second impedance when the first field-effect transistor is transmitting a signal having a second frequency higher than the first frequency. In certain embodiments, the first field-effect transistor is a silicon-on-insulator field-effect transistor.

In certain embodiments, the adjustable impedance network includes a second field-effect transistor having a gate, a drain, and a source. For example, the second field-effect transistor may be connected at one of the drain or source of the second field-effect transistor to the body of the first field-effect transistor and connected at the other of the drain or the source of the second field-effect transistor to the ground reference. The second field-effect transistor may be operable to provide a desired impedance for reducing undesired radio-frequency distortion in the first field-effect transistor at a frequency of operation. In certain embodiments, the adjustable impedance network includes one or more resistors connected in series with the second field-effect transistor. The adjustable impedance network may include one or more capacitors connected in series with the second field-effect transistor.

The adjustable impedance network may include a capacitor. For example, the capacitor may be connected at a first end to the body of the first field-effect transistor and at a second end to the ground reference. In certain embodiments, the adjustable impedance network includes a capacitor connected in series with an inductor. The adjustable impedance network may include a plurality of capacitors configured to be selectively coupled to the body of the first field-effect transistor using a network of switches.

In some implementations, the present disclosure relates to a method for fabricating a semiconductor die. The method comprises providing a semiconductor substrate, forming a first field-effect transistor on the semiconductor substrate, the first field-effect transistor having a source, a drain, a gate, and a body, coupling the body of the gate of the first field-effect transistor using a coupling path that includes a diode, and forming an adjustable impedance network on the semiconductor substrate connected between the body of the first field-effect transistor and a ground reference, the adjustable impedance network being configured to reduce radio-frequency distortion in the first field-effect transistor.

The method may further comprise forming an insulator layer between the FET and the semiconductor substrate. In certain embodiments, the adjustable impedance network includes a second field-effect transistor having a gate, a drain, and a source, the second field-effect transistor being connected at one of the drain or source of the second field-effect transistor to the body of the first field-effect transistor and connected at another of the drain or source of the second field-effect transistor to the ground reference. In certain embodiments, the adjustable impedance network includes a capacitor connected at a first end to the body of the first FET and at a second end to the ground reference. In certain embodiments, the adjustable impedance network includes a capacitor connected in series with an inductor.

In some implementations, the present disclosure relates to a radio-frequency switch module comprising a packaging substrate configured to receive a plurality of components, a semiconductor die mounted on the packaging substrate, the semiconductor die including a first field-effect transistor having a gate, a drain, a source, and a body, a coupling path connected between the body of the first field-effect transistor and one of the source, the drain, and the gate of the first field-effect transistor, the coupling path including a diode, and an impedance control circuit connected between the body of the first field-effect transistor and a ground reference, the adjustable impedance network being configured to reduce radio-frequency distortion in the first field-effect transistor.

The impedance control circuit may include a second field-effect transistor having a gate, a drain, and a source. For example, the second field-effect transistor may be connected at one of the drain or source of the second field-effect transistor to the body of the first field-effect transistor. In certain embodiments, the impedance control circuit includes a capacitor connected to the body of the first field effect transistor. In certain embodiments, the impedance control circuit includes a capacitor connected in series with an inductor.

BRIEF DESCRIPTION OF THE DRAWINGS

FIGS. 10A-10C are diagrams of switch arms according to one or more embodiments.

DETAILED DESCRIPTION OF SOME EMBODIMENTS

The headings provided herein are for convenience only and do not necessarily affect the scope or meaning of the claimed invention.

Example Components of a Switching Device:

Disclosed herein are radio frequency (RF) switches, devices, modules and systems that provide for improved radiated spurious emissions (RSE) and/or linearity through the use of transistor body biasing and/OR impedance control. The principles of the present disclosure are presented in various contexts herein, including RF antenna switch modules (ASM) and other RF switching devices, which may be discrete components or integrated with one or more other components of a device or system.

Figure 1:
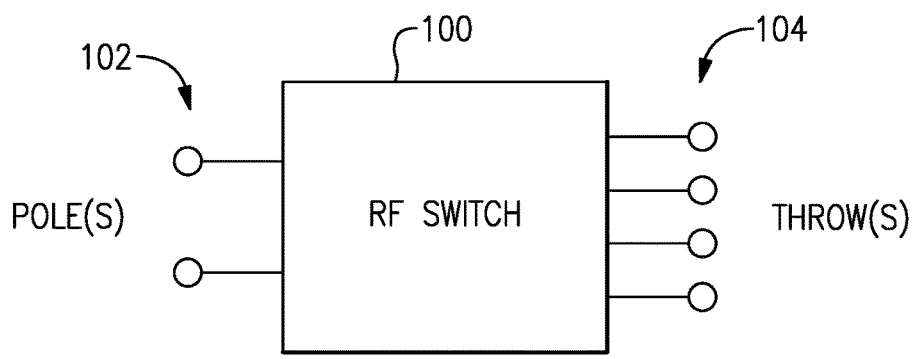
FIG. 1 is a block diagram of an RF switch according to one or more embodiments.

FIG. 1 schematically shows an RF switch 100 configured to switch one or more signals between one or more poles 102 and one or more throws 104. For example, the RF switch 100 may be an antenna switch module (ASM), or component thereof. In some embodiments, the switch 100 can be based on one or more field-effect transistors (FETs), such as silicon-on-insulator (SOI) FETs. When a particular pole is connected to a particular throw, such a path is commonly referred to as being closed or in an ON state. When a given path between a pole and a throw is not connected, such a path is commonly referred to as being open or in an OFF state.

In certain embodiments, the switch 100 may be a substantially discrete component that is communicatively coupled to an antenna of a wireless communication device, such as a smartphone or other mobile computing device or device configured for wireless communications. Additional details of how a switch in accordance with the present disclosure may be connected within a wireless communication device are provided below in connection with FIG. 16. The configuration of the switch 100 may have an effect on antenna efficiency with respect to power handling or other performance parameters.

When the RF switch 100 is coupled to an antenna, the impedance presented by the antenna may change, possibly drastically, based on an environment in which the antenna is currently disposed. For example, if the antenna is placed in a user's hand or pocket, or in a box or other structure, or in close proximity or contact with a conductive surface or object, each such environment may result in a different effective impedance of the antenna. When the antennan impedance changes, the power level at the antenna may likewise change, possibly drastically. For example, in one embodiment, antenna power levels may swing from around 36 dBm to around 48 (dBm) in certain conditions; voltage may swing from around 20 V to as high as 60, 70 or 80 V, or higher. Such increased power levels can result in radiated spurious emissions (RSE), which can be problematic due at least in part to certain requirements that may be in place requiring that antenna RSE levels not exceed acceptable levels.

With respect to a switch designer, however, perfect antennan impedance matching may not be practical. Therefore, it may be desirable to implement a switch that is designed to reduce RSE even in the presence of impedance mismatch, even severe mismatch. When there is substantial impedance mismatch at the switch/antenna interface, a high voltage can be generated at the antenna, causing degradation in harmonics; the higher the voltage, the worse the effect on harmonics. Certain embodiments disclosed herein provide for reduced RSE and/or improved linearity through the use of transistor body biasing and/or impedance control.

Figure 2:
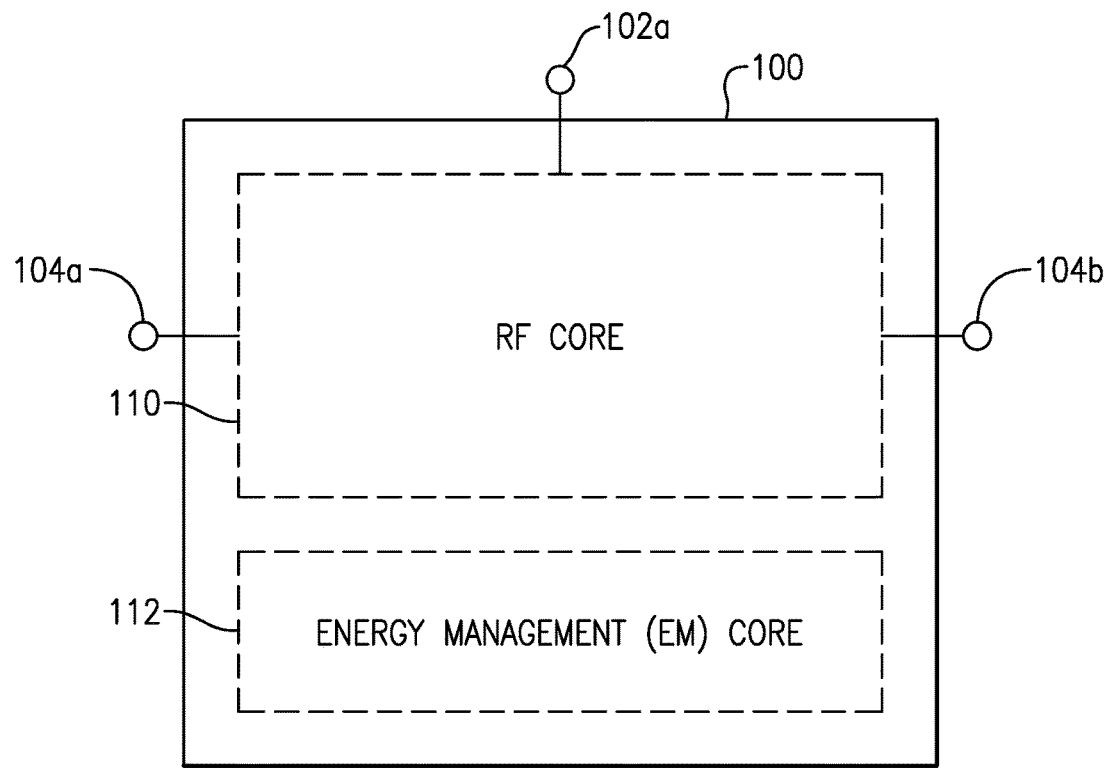
FIG. 2 is a block diagram of an RF switch according to one or more embodiments.

FIG. 2 shows that in some implementations, the RF switch 100 of FIG. 1 can include an RF core 110 and an energy management (EM) core 112. The RF core 110 can be configured to route RF signals between the first and second ports. In the example single-pole-double-throw (SPDT) configuration shown in FIG. 2, such first and second ports can include a pole 102a and a first throw 104a, or the pole 102a and a second throw 104b.

In some embodiments, EM core 112 can be configured to supply, for example, voltage control signals to the RF core. The EM core 112 can be further configured to provide the RF switch 100 with logic decoding and/or power supply conditioning capabilities.

In some embodiments, the RF core 110 can include one or more poles and one or more throws to enable passage of RF signals between one or more inputs and one or more outputs of the switch 100. For example, the RF core 110 can include a single-pole double-throw (SPDT or SP2T) configuration as shown in FIG. 2.

Figure 3:
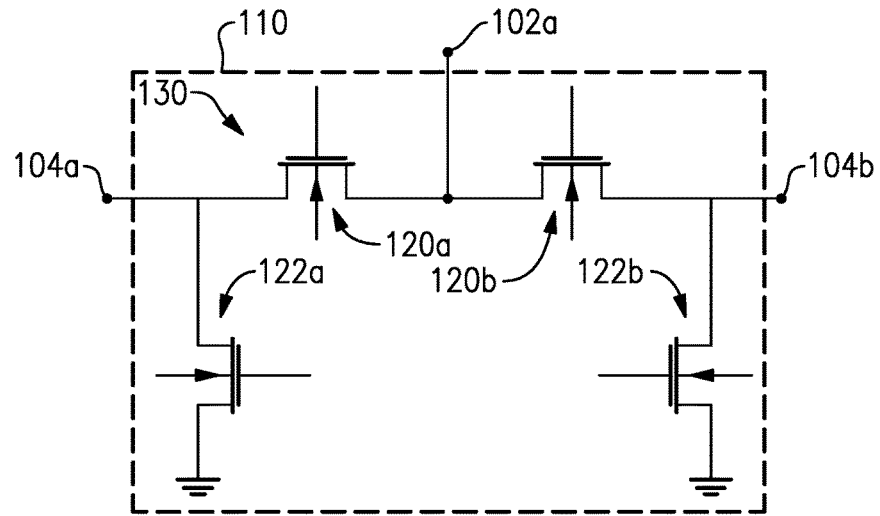
FIG. 3 is a diagram of an RF core according to one or more embodiments.

In the example SPDT context, FIG. 3 shows a more detailed example configuration of an RF core 110. The RF core 110 is shown to include a single pole 102a coupled to first and second throw nodes 104a, 104b via first and second transistors (e.g., FETs) 120a, 120b. The first throw node 104a is shown to be coupled to an RF ground via an FET 122a to provide shunting capability for the node 104a. Similarly, the second throw node 104b is shown to be coupled to the RF ground via an FET 122b to provide shunting capability for the node 104b.

In an example operation, when the RF core 110 is in a state where an RF signal is being passed between the pole 102a and the first throw 104a, the FET 120a between the pole 102a and the first throw node 104a can be in an ON state, and the FET 120b between the pole 102a and the second throw node 104b can be in an OFF state. For the shunt FETs 122a, 122b, the shunt FET 122a can be in an OFF state so that the RF signal is not shunted to ground as it travels from the pole 102a to the first throw node 104a. The shunt FET 122b associated with the second throw node 104b can be in an ON state so that any RF signals or noise arriving at the RF core 110 through the second throw node 104b is shunted to the ground so as to reduce undesirable interference effects to the pole-to-first-throw operation.

Although the foregoing example is described in the context of a single-pole-double-throw configuration, it will be understood that the RF core can be configured with other numbers of poles and throws. For example, there may be more than one poles, and the number of throws can be less than or greater than the example number of two.

In some RF applications, it can be desirable for RF switching devices to operate under high power while reducing degradation of other device performance parameters. In some embodiments, it can be desirable for RF switching devices to operate under high power with improved radiated spurious emissions (RSE), intermodulation distortion, insertion loss, and/or isolation performance.

In some embodiments, an increased number of transistors can be implemented in a switch arm segment of a switching device to enable improved power handling capability of the switching device. For example, a switch arm segment can include an increased number of FETs connected in series, an increased FET stack height, to enable improved device performance under high power. However, in some embodiments, increased FET stack height can degrade the switching device insertion loss performance.

In the example of FIG. 3, the transistors between the pole 102a and the two throw nodes 104a, 104b are depicted as single transistors. In some implementations, such switching functionalities between the pole(s) and the throw(s) can be provided by switch arm segments, where each switch arm segment includes a plurality of transistors such as FETs.

Figure 4:
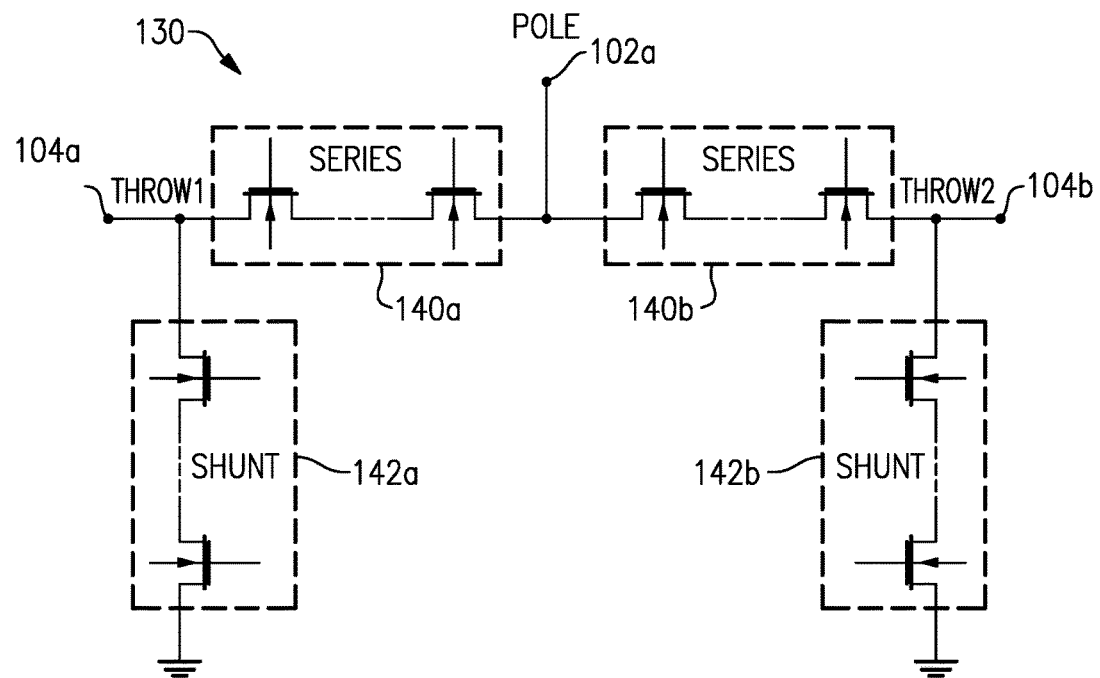
FIG. 4 is a diagram of an RF core according to one or more embodiments.

An example RF core configuration 130 of an RF core having such switch arm segments is shown in FIG. 4. In the example, the pole 102a and the first throw node 104a are shown to be coupled via a first switch arm segment 140a. Similarly, the pole 102a and the second throw node 104b are shown to be coupled via a second switch arm segment 140b. The first throw node 104a is shown to be capable of being shunted to an RF ground via a first shunt arm segment 142a. Similarly, the second throw node 104b is shown to be capable of being shunted to the RF ground via a second shunt arm segment 142b.

In an example operation, when the RF core 130 is in a state where an RF signal is being passed between the pole 102a and the first throw node 104a, all of the FETs in the first switch arm segment 140a can be in an ON state, and all of the FETs in the second switch arm segment 104b can be in an OFF state. The first shunt arm 142a for the first throw node 104a can have all of its FETs in an OFF state so that the RF signal is not shunted to ground as it travels from the pole 102a to the first throw node 104a. All of the FETs in the second shunt arm 142b associated with the second throw node 104b can be in an ON state so that any RF signals or noise arriving at the RF core 130 through the second throw node 104b is shunted to the ground so as to reduce undesirable interference effects to the pole-to-first-throw operation.

Again, although described in the context of an SP2T configuration, it will be understood that RF cores having other numbers of poles and throws can also be implemented.

In some implementations, a switch arm segment (e.g., 140a, 140b, 142a, 142b) can include one or more semiconductor transistors such as FETs. In some embodiments, an FET may be capable of being in a first state or a second state and can include a gate, a drain, a source, and a body (sometimes also referred to as a substrate. In some embodiments, an FET can include a metal-oxide-semiconductor field effect transistor (MOSFET). In some embodiments, one or more FETs can be connected in series forming a first end and a second end such that an RF signal can be routed between the first end and the second end when the FETs are in a first state (e.g., ON state).

Figure 5:
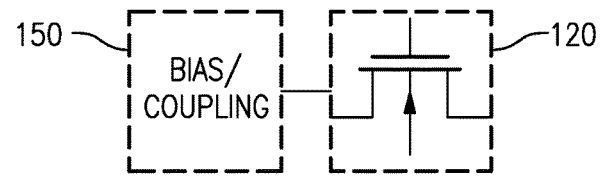
FIG. 5 is a diagram of a circuit configured to bias and/or couple one or more portions of a transistor according to one or more embodiments.

At least some of the present disclosure relates to how an FET or a group of FETs can be controlled to provide switching functionalities in desirable manners. FIG. 5 schematically shows that in some implementations, such controlling of an FET 120 can be facilitated by a circuit 150 configured to bias and/or couple one or more portions of the FET 120. In some embodiments, such a circuit 150 can include one or more circuits configured to bias and/or couple a gate of the FET 120, bias and/or couple a body of the FET 120, and/or couple a source/drain of the FET 120.

Figure 6:
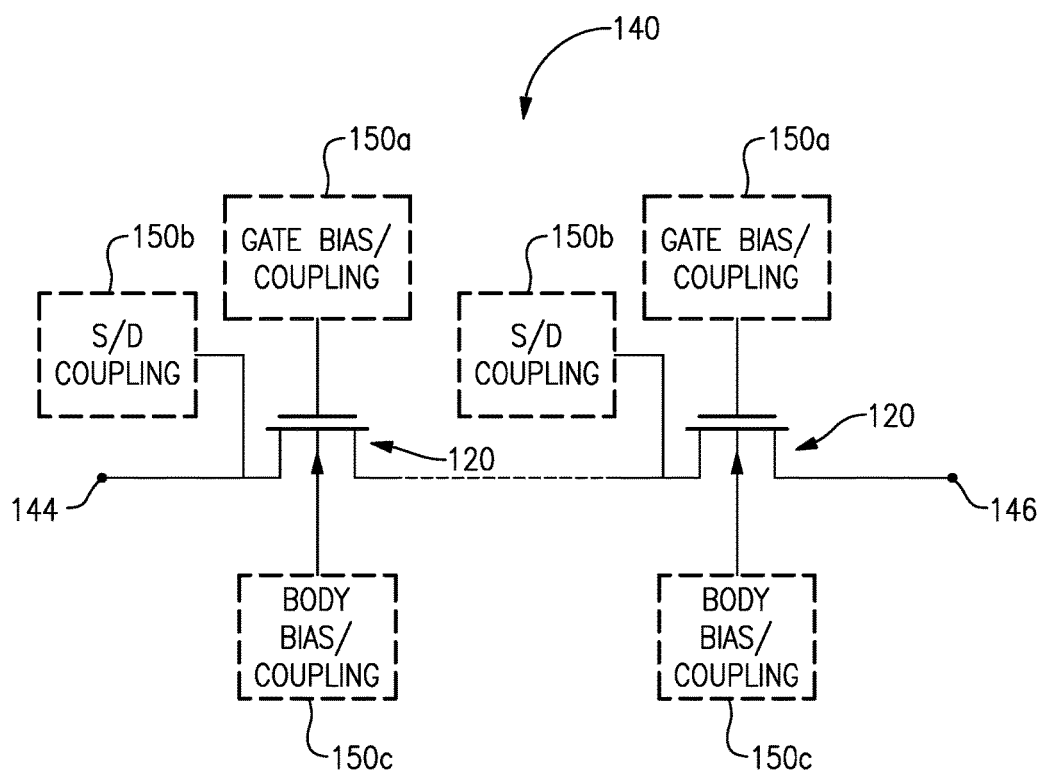
FIG. 6 is a diagram of a circuit for biasing and/or coupling of different parts of one or more transistors in accordance with one or more embodiments.

Schematic examples of how such biasing and/or coupling of different parts of one or more FETs are described in reference to FIG. 6. In FIG. 6, a switch arm segment 140 (that can be, for example, one of the example switch arm segments 140a, 140b, 142a, 142b of the example of FIG. 4) between nodes 144, 146 is shown to include a plurality of FETs 120. Operations of such FETs can be controlled and/or facilitated by a gate bias/coupling circuit 150a, and a body bias/coupling circuit 150c, and/or a source/drain coupling circuit 150b.

Gate Bias/Coupling Circuit

In the example shown in FIG. 6, the gate of each of the FETs 120 can be connected to the gate bias/coupling circuit 150a to receive a gate bias signal and/or couple the gate to another part of the FET 120 or the switch arm 140. In some implementations, designs or features of the gate bias/coupling circuit 150a can improve performance of the switch arm 140. Such improvements in performance can include, but are not limited to, device insertion loss, isolation performance, power handling capability and/or switching device linearity.

Body Bias/Coupling Circuit

As shown in FIG. 6, the body of each FET 120 can be connected to the body bias/coupling circuit 150c to receive a body bias signal and/or couple the body to another part of the FET 120 or the switch arm 140. In some implementations, designs or features of the body bias/coupling circuit 150c can improve performance of the switch arm 140. Such improvements in performance can include, but are not limited to, device insertion loss, isolation performance, power handling capability and/or switching device linearity.

Source/Drain Coupling Circuit

As shown in FIG. 6, the source/drain of each FET 120 can be connected to the coupling circuit 150b to couple the source/drain to another part of the FET 120 or the switch arm 140. In some implementations, designs or features of the coupling circuit 150b can improve performance of the switch arm 140. Such improvements in performance can include, but are not limited to, device insertion loss, isolation performance, power handling capability and/or switching device linearity.

Examples of FET Structures and Fabrication Process Technologies:

A switching device in accordance with embodiments disclosed herein can be implemented on-die, off-die, or some combination thereof. A switching device can also be fabricated using various technologies. In some embodiments, RF switching devices can be fabricated with silicon or silicon-on-insulator (SOI) technology. Although certain embodiments are described herein in the context of SOI switches and devices, it should be understood that the principles discussed in association therewith may be applicable in other technologies.

As described herein, an RF switching device can be implemented using silicon-on-insulator (SOI) technology. In some embodiments, SOI technology can include a semiconductor substrate having an embedded layer of electrically insulating material, such as a buried oxide layer beneath a silicon device layer. For example, an SOI substrate can include an oxide layer embedded below a silicon layer. Other insulating materials known in the art can also be used.

Implementation of RF applications, such as an RF switching device, using SOI technology can improve switching device performance. In some embodiments, SOI technology can enable reduced power consumption. Reduced power consumption can be desirable in RF applications, including those associated with wireless communication devices. SOI technology can enable reduced power consumption of device circuitry due to decreased parasitic capacitance of transistors and interconnect metallization to a silicon substrate. Presence of a buried oxide layer can also reduce junction capacitance or use of high resistivity substrate, enabling reduced substrate related RF losses. Electrically isolated SOI transistors can facilitate stacking, contributing to decreased chip size.

Figure 7A:
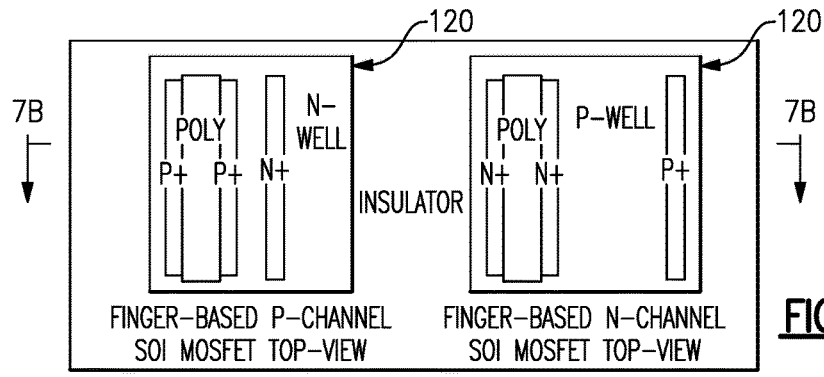
FIGS. 7A and 7B show plan and side sectional views of an example finger-based transistor device according to one or more embodiments.
Figure 7B:
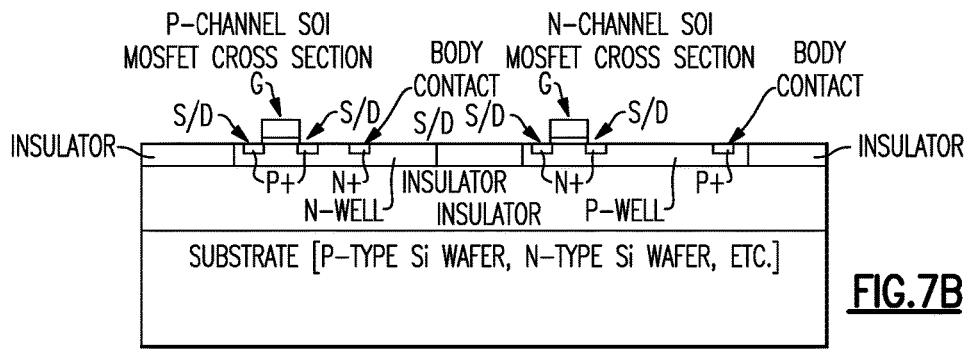

In some SOI FET configurations, each transistor can be configured as a finger-based device where the source and drain are rectangular shaped (in a plan view) and a gate structure extends between the source and drain like a rectangular shaped finger. FIGS. 7A and 7B show plan and side sectional views of an example finger-based FET device implemented on SOI. As shown, FET devices described herein can include a p-type FET or an n-type FET. Thus, although some FET devices are described herein as p-type devices, it will be understood that various concepts associated with such p-type devices can also apply to n-type devices.

As shown in FIGS. 7A and 7B, a pMOSFET can include an insulator layer formed on a semiconductor substrate. The insulator layer can be formed from materials such as silicon dioxide or sapphire. An n-well is shown to be formed in the insulator such that the exposed surface generally defines a rectangular region. Source (S) and drain (D) are shown to be p-doped regions whose exposed surfaces generally define rectangles. As shown, S/D regions can be configured so that source and drain functionalities are reversed.

FIGS. 7A and 7B further show that a gate (G) can be formed on the n-well so as to be positioned between the source and the drain. The example gate is depicted as having a rectangular shape that extends along with the source and the drain. Also shown is an n-type body contact. Formations of the rectangular shaped well, source and drain regions, and the body contact can be achieved by a number of known techniques. In some embodiments, the source and drain regions can be formed adjacent to the ends of their respective upper insulator layers, and the junctions between the body and the source/drain regions on the opposing sides of the body can extend substantially all the way down to the top of the buried insulator layer. Such a configuration can provide, for example, reduced source/drain junction capacitance. To form a body contact for such a configuration, an additional gate region can be provided on the side so as to allow, for example, an isolated P+ region to contact the Pwell.

Figure 8A:
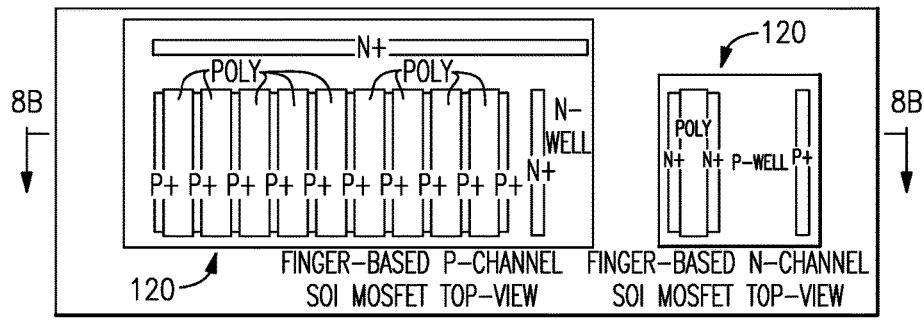
FIGS. 8A and 8B show plan and side sectional views of an example of a multiple-finger transistor device according to one or more embodiments.
Figure 8B:
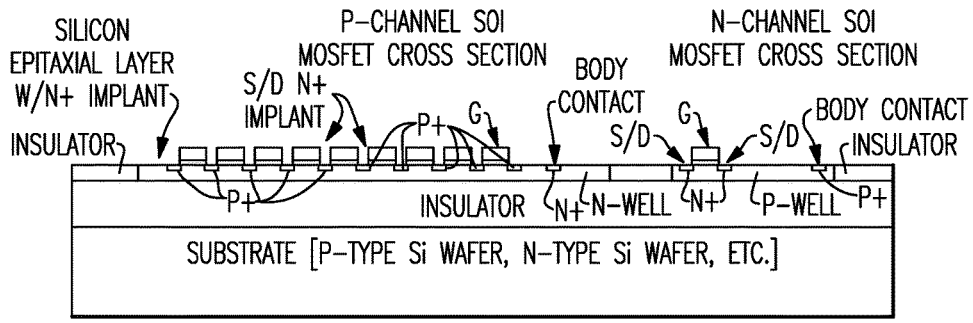

FIGS. 8A and 8B show plan and side sectional views of an example of a multiple-finger FET device implemented on SOI. Formations of rectangular shaped n-well, rectangular shaped p-doped regions, rectangular shaped gates, and n-type body contact can be achieved in manners similar to those described in reference to FIGS. 7A and 7B.

The example multiple-finger FET device of FIGS. 8A and 8B can be made to operate such that a drain of one FET acts as a source of its neighboring FET. Thus, the multiple-finger FET device as a whole can provide a voltage-dividing functionality. For example, an RF signal can be provided at one of the outermost p-doped regions (e.g., the leftmost p-doped region); and as the signal passes through the series of FETs, the signal's voltage can be divided among the FETs. In such an example, the rightmost p-doped region can act as an overall drain of the multi-finger FET device.

In some implementations, a plurality of the foregoing multi-finger FET devices can be connected in series as a switch to, for example, further facilitate the voltage-dividing functionality. A number of such multi-finger FET devices can be selected based on, for example, power handling requirement of the switch.

Diode Body FET

As described above, in the presence of switch/antennan impedance mismatch conditions, relatively high voltage can be generated causing radiated spurious emissions (RSE) to increase due to harmonics from the tuning switch transistor(s) (e.g., FETs). The terms "radiated spurious emissions" and "RSE" are used herein according to their broad and ordinary meaning and may refer to any undesirable radio-frequency distortion or harmonic generation in radio-frequency switching devices. Certain embodiments disclosed herein provide for at least partially improved RSE at an antenna interface from a switching device. In some implementations, susceptibility to RSE may be reduced by improving linearity of the switch system. Through improved linearity of the system's building blocks (such as RF switch(es)), an overall susceptibility of the system to RSE may be decreased.

In some implementations, a body terminal of a switch transistor and one or more other terminals of the transistor can be coupled to and/or by a circuit configured to provide at least partial RSE performance improvement. Certain embodiments are shown in the figures and described herein in which coupling between a switch transistor body and one or more other nodes of the transistor (e.g., drain, source, gate) is implemented. However, it should be understood that the disclosed embodiments and principles described in connection therewith may be implemented in other coupling configurations. For example, whereas a body-to-gate diode coupling may be illustrated and/or described in connection with a particular embodiment, it should be understood that the features/concepts associated with the embodiment may be applicable in systems using body-to-drain and/or body-to-source coupling designs.

Figure 9C:
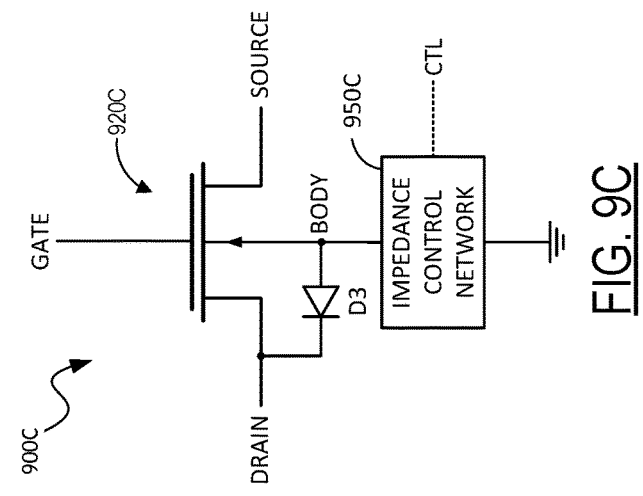
FIGS. 9A-9C are diagrams of circuits having a respective transistor with a diode-body connection and an impedance control network according to various embodiments.
Figure 9B:
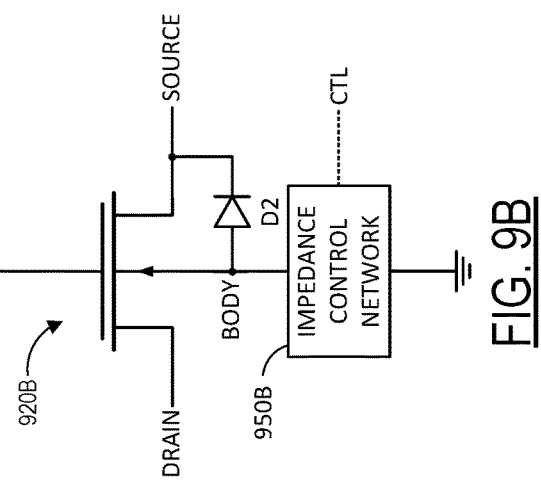
Figure 9A:
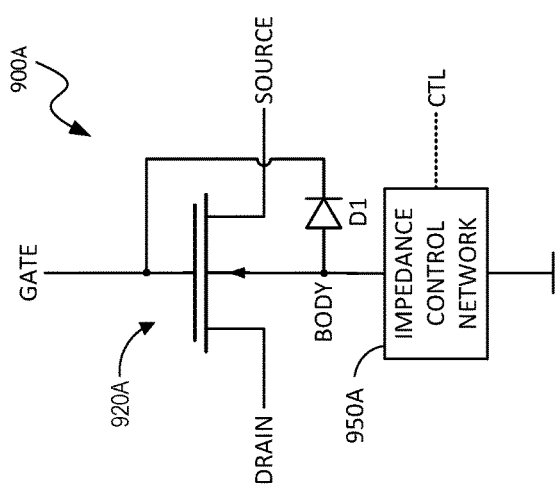

FIGS. 9A-9C show switch circuit examples (950A-950C) having a respective transistor (920A-920C) configured to provide switching functionality between first (e.g., drain) and second (e.g., source) nodes 144, 146. The circuits of FIGS. 9A-9C include transistors having a body connection through a diode, as shown. The bodies of the respective transistors in FIGS. 9A-9C are further coupled to ground through a biasing and/or impedance control circuit (950A-950C, respectively). The impedance control networks may be used to design a transistor impedance, and may vary from architecture to architecture. The switch circuits of FIGS. 9A-9C may be utilized in any product, process, device or system that includes one or more transistors having body access points or nodes. For example, technologies in which body biasing and impedance control may be utilized may include CMOS, SOI, SOS (silicon-on-sapphire), or other technologies. Use of the bias/impedance control may improve overall switch performance without substantial performance degradation. References herein to body contacts of transistor devices may be understood be references to body contacts, substrate contacts, or both.

In each of the examples shown in FIGS. 9A-9C, a body node of the respective transistor is coupled to a circuit (950A-950C) configured to provide at least partial reduction in radiated spurious emissions (RSE). The impedance control network may provide a tunable impedance to ground for the body. For the purpose of description of FIGS. 9A-9C, the circuit is referred to as an impedance control network. The circuit (950A-950C) may provide one or more of biasing functionality and impedance control functionality with respect to the respective transistor device. For example, the impedance at the body node may generally conduct current, wherein the higher the impedance, the less the amount of current leakage in the diode (D1, D2, D3), which may provide improved performance at breakdown of the diode.

FIG. 9A shows a switch circuit having a diode-body connection, wherein the body node of the transistor 920A is coupled to the gate node of the transistor 920A via a coupling path that includes a diode D1. In certain embodiments, the diode D1 may be forward-biased from the body node to the gate node. The transistor 920A may be, for example, an SOI FET. The body node is further coupled to ground via an impedance control network 950A in accordance with one or more embodiments disclosed herein. The circuit 950A may be used to advantageously control the connected diode D1. The impedance control network 950A may be configurable to provide an adjustable impedance. In such implementations, the impedance of the impedance control network 950A may be adjusted using a control signal ("CTL"), which may control or activate one or more switches to selectively couple one or more capacitive devices (e.g., capacitors, transistors, etc.) to the body node of the transistor 920A. Furthermore, in certain embodiments, the impedance control network 950A includes one or more devices having frequency-dependent impedance, and therefore the impedance control network 950A may advantageously provide varying impedances for different frequency bands of operation. In certain embodiments, the impedance control network has a fixed impedance.

FIG. 9B shows a switch circuit where a coupling path including a diode D2 couples a source terminal of a transistor 920B with a body terminal of the transistor 920B. In certain embodiments, the diode D2 may be forward-biased from the body node to the source node of the transistor 920B. The transistor 920B may be, for example, an SOI FET. The body node is further coupled to ground via an impedance control network 950B in accordance with one or more embodiments disclosed herein. The circuit 950B may be used to advantageously control the connected diode D2. The impedance control network 950B may be configurable to provide an adjustable impedance. In such implementations, the impedance of the impedance control network 950B may be adjusted using a control signal ("CTL"), which may control or activate one or more switches to selectively couple one or more capacitive devices (e.g., capacitors, transistors, etc.) to the body node of the transistor 920B. Furthermore, in certain embodiments, the impedance control network 950B includes one or more devices having frequency-dependent impedance, and therefore the impedance control network 950B may advantageously provide varying impedances for different frequency bands of operation. In certain embodiments, the impedance control network has a fixed impedance.

FIG. 9C shows a switch circuit where a coupling path including a diode D3 couples a body terminal of a transistor 920C with a drain terminal of the transistor 920C. In certain embodiments, the diode D3 may be forward-biased from the body node to the drain node of the transistor 920C. The transistor 920B may be, for example, an SOI FET. The body node is further coupled to ground via an impedance control network 950C in accordance with one or more embodiments disclosed herein. The circuit 950C may be used to advantageously control the connected diode D3. The impedance control network 950C may be configurable to provide an adjustable impedance. In such implementations, the impedance of the impedance control network 950C may be adjusted using a control signal ("CTL"), which may control or activate one or more switches to selectively couple one or more capacitive devices (e.g., capacitors, transistors, etc.) to the body node of the transistor 920C. Furthermore, in certain embodiments, the impedance control network 950C includes one or more devices having frequency-dependent impedance, and therefore the impedance control network 950C may advantageously provide varying impedances for different frequency bands of operation. In certain embodiments, the impedance control network has a fixed impedance.

The sizes of the diodes D1, D2, D3 may vary based on the specific design of the respective circuit. Example sizes for the diodes D1, D2, D3 may include 3 µm, 6 µm, or other value. Furthermore, the type (e.g., voltage) can vary based on the circuit design. In certain embodiments, the diodes D1, D2, D3 may each represent a single diode or a stack of multiple diodes, depending on the needs for the particular application.

Figure 10B:
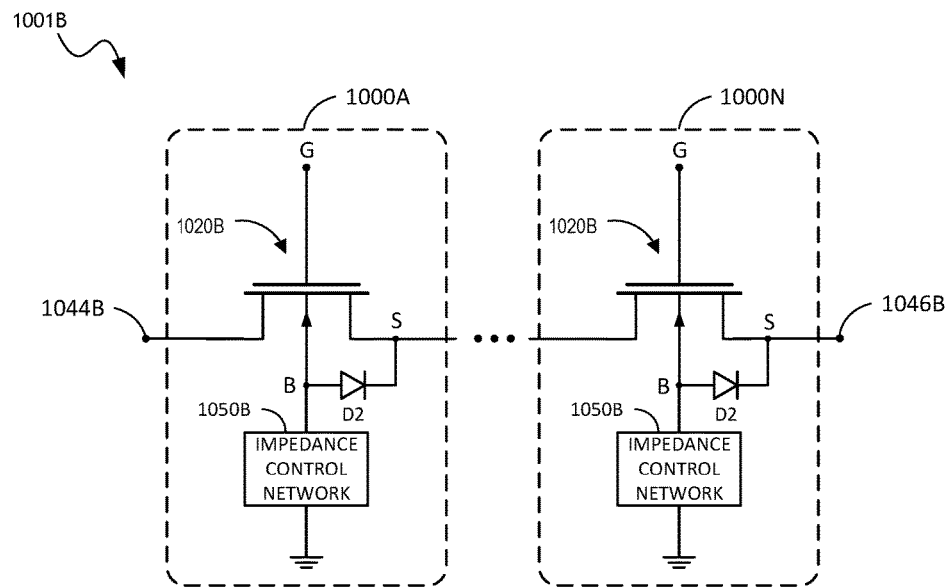
Figure 10C:
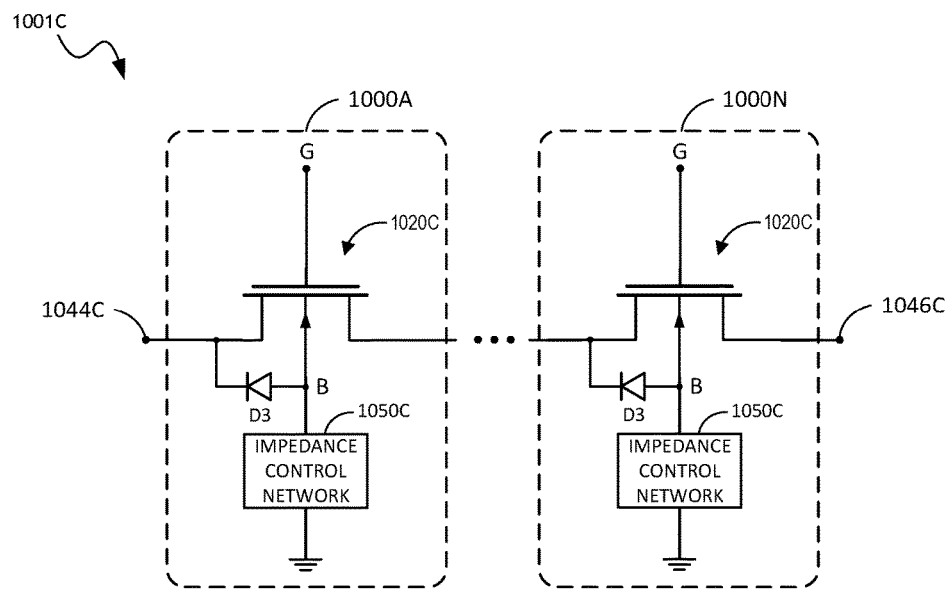

FIGS. 10A-10C show switch arms (1001A-1001C) having switch circuits (1000A-1000N) similar to those described in reference to FIGS. 9A-9C. In each of the examples, N such switch circuits are shown to be connected in series to provide switching functionality between terminals 1044 and 1046.

In some embodiments, gate bias voltages (Vg) for the plurality of transistors (e.g., 1020A with respect to FIG. 10A) can be substantially the same, and be provided by a common gate bias circuit. Similarly, body bias voltages (Vb) for the plurality of transistors (e.g., 1020A with respect to FIG. 10A) can be substantially the same, and be provided by a common body bias circuit (e.g., 1050A).

In some embodiments, some or all of the bodies of the FETs 1020 can be biased and/or impedance controlled separately. In some situations, such as when substantially equal voltage division across the FETs is desired, it can be advantageous to implement such separate biasing of bodies. In some implementations, and as described herein, the foregoing example configurations described in reference to FIGS. 9A-9C and 10A-10C can yield improvements in RSE.

Figure 12:
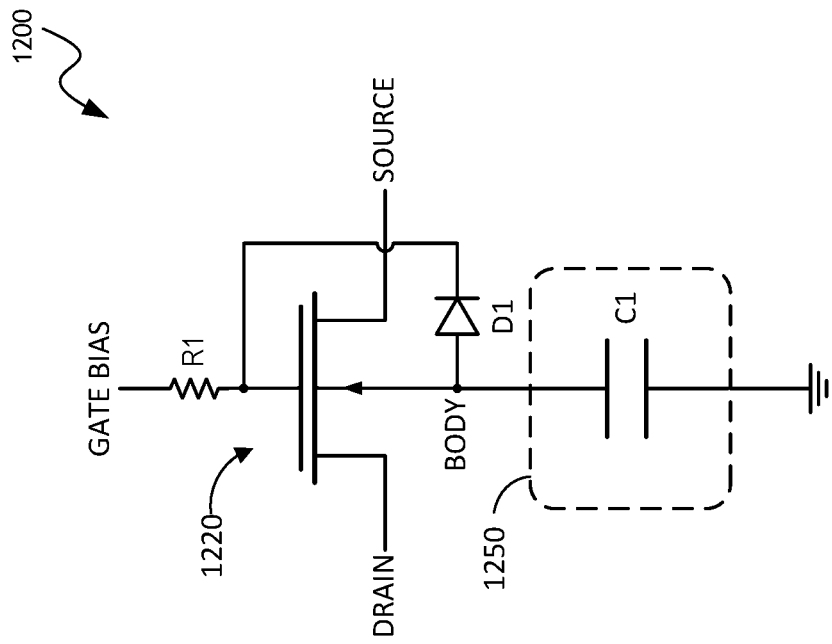
FIG. 12 illustrates a switch circuit including a body-connected impedance network having a capacitor according to one or more embodiments.
Figure 11:
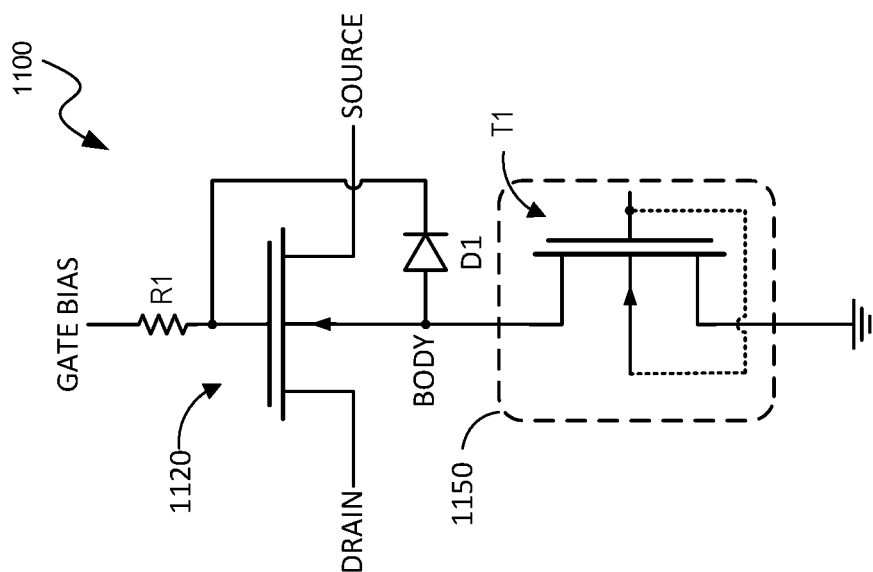
FIG. 11 illustrates a switch circuit including a body-connected impedance network having a transistor according to one or more embodiments.

FIG. 11 illustrates a switch circuit 1100 including a transistor 1120. The transistor 1120 may be a diode body FET similar to one or more of the transistors illustrated in FIGS. 9A-9C. FIG. 12 illustrates a switch circuit 1200 including a transistor 1220. The transistor 1220 may be a diode body FET similar to one or more of the transistors illustrated in FIGS. 9A-9C. In FIGS. 11 and 12, the respective transistors (1120, 1220) may include a body coupling path including a diode D2 coupled to the gate of the respective transistor. Although a gate connection is shown in FIGS. 11 and 12, it should be understood that the body diode D2 may be connected to one or more of the drain, source or gate of the respective transistor, as shown in FIGS. 9A-9C. The circuits 1150, 1250, 1350 may present different impedances for different frequency signals through the use of capacitive impedance. For example, for each of the circuits 1150, the impedance may be relatively higher for low-band solutions and relatively lower for high-band solutions. Therefore, the circuits 1150, 1250, 1350 may advantageously provide a desirable impedance for each of multiple bands in a multi-band solution. Body-connected impedance control circuits in accordance with the present disclosure may provide reduced harmonics for at least two different frequencies of interest.

Figure 13:
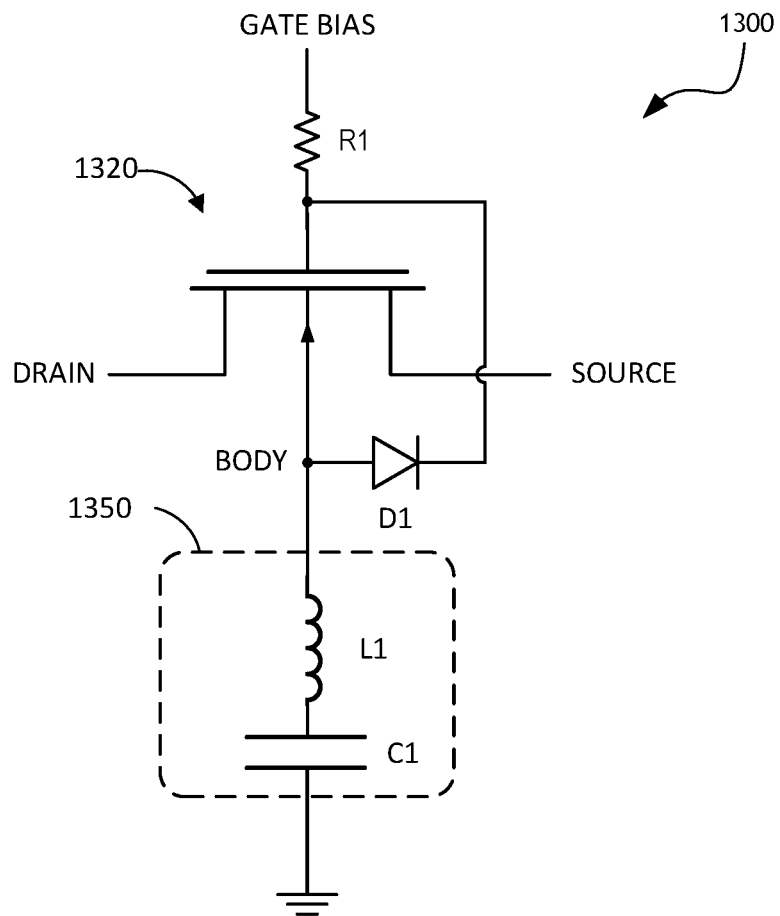
FIG. 13 illustrates a switch circuit including a body-connected impedance network including a capacitor and an inductor according to one or more embodiments.

Each of the circuits of FIGS. 11, 12 and 13 includes an example body-coupled impedance control network (1150, 1250, 1350, respectively) in accordance with one or more embodiments. In certain embodiments, a body-coupled impedance control network as described herein may include a capacitance to ground and/or a bias impedance control at the body node of a switch transistor. By adding a capacitive impedance at the body-diode connection, the body impedance may change with frequency of the RF signal, and therefore the response of the body diode may also change with the frequency.

Added capacitance in the illustrated impedance control networks of FIGS. 11, 12 and 13 may be achieved using one or more process capacitors or transistors (e.g., FETs), for example. Adding capacitance at the diode/body contact using one or more capacitors and/or transistors to achieve the desired impedance may serve to generates improved harmonics at relatively high power, and may exhibit improved voltage handling and/or power linearity.

In the example of FIG. 11, the impedance control network 1150 may include a transistor T1. The dimensions/value of the transistor T1 may advantageously be selected based on the desired impedance; the OFF-state drain-to-source capacitance of the transistor T1 may control the impedance of the diode D2. Using the transistor T1 as an OFF device during operation can provide a drain-to-source capacitance between the body of the transistor 1120 and ground. The ability to turn the transistor T1 OFF or ON may provide selectability for the impedance of the circuit 1150 to advantageously meet desired design parameters. Therefore, the use of the transistor T1 as a bias/impedance control element may provide desirable design flexibility. For example, high-band solutions may advantageously utilize different capacitance values than low-band solutions. In certain embodiments, the body of the transistor T1 may be coupled to the gate of the transistor T1. In certain embodiments, the body of the transistor T1 is coupled to the gate of the transistor T1, as shown by the dashed-line coupling path.

In the example of FIG. 12, the impedance control network 1250 may include a capacitor C1. The dimensions/value of the capacitor C1 may advantageously be selected based on the desired impedance. In certain embodiments, the capacitor C1 may be a variable capacitor, allowing for dynamically-selectable capacitance. In certain embodiments, capacitance selectability of the circuit 1250 is achieved through the use of a plurality of switch-connected capacitors (or transistors), connected in series or in parallel, wherein turning ON and/or OFF of one or more of the switches may result in a selected capacitance. Such selective capacitance may be controlled by an energy management core associated with the switch circuit 1200. The capacitor C1 may be represented by an OFF switch (e.g., transistor).

Use of the capacitor C1 may be desirable in certain applications as an alternative to the transistor embodiment of FIG. 11 due at least in part to the relatively fewer number of nodes generally associated with a capacitor (e.g., 2) relative to a transistor (e.g., 3 or 4). Furthermore, whereas a transistor may need to be maintained in an OFF state during certain periods, additional bias voltage may be required to operate the circuit 1150 of FIG. 11 compared to the circuit 1250 of FIG. 12.

In the example of FIG. 13, the impedance control network 1350 may include a frequency-selective tank circuit. In certain embodiments, the impedance control network includes an inductor L1 connected in series with a capacitor C1. Although the inductor L1 and capacitor C1 are shown connected in a certain order, it should be understood that the circuit 1350 may include any order of connection for the inductor and capacitor, or may include any desirable or suitable tank circuit configuration. The dimensions/values of the inductor L1 and capacitor C1 may advantageously be selected based on the desired impedance. The capacitor C1 and inductor L1 may each present frequency-dependent impedances, and therefore, the impedance of the circuit 1350 may be variable based on frequency of operation of the circuit 1300.

Table A, presented below, provides example power data that may potentially be achieved in a system implementing impedance control as disclosed herein.

TABLE A

| | FET OFF-state-Non-Linearity Bias/Impedance Control | | FET OFF state-Non-Linearity; No Bias/Impedance Control | | Improvement | |
| --- | --- | --- | --- | --- | --- | --- |
| Power (dBm) | Second Harmonic (dBc) | Third Harmonic (dBc) | Second Harmonic (dBc) | Third Harmonic (dBc) | Second Harmonic | Third Harmonic |
| 15 | −70 | −62 | −76 | −62 | −6 | 0 |
| 16 | −69 | −59 | −74 | −59 | −5 | 0 |
| 17 | −67 | −55 | −72 | −56 | −5 | −1 |
| 18 | −65 | −51 | −69 | −52 | −4 | −1 |
| 19 | −62 | −45 | −65 | −48 | −3 | −3 |
| 20 | −59 | −38 | −35 | −24 | 24 | 14 |
| 21 | −44 | −23 | −32 | −23 | 12 | 0 |
| 22 | −45 | −23 | −31 | −22 | 14 | 1 |

TABLE A-continued

| | FET OFF-state-Non-Linearity Bias/Impedance Control | | FET OFF state-Non-Linearity; No Bias/Impedance Control | | Improvement | |
|---|---|---|---|---|---|---|
| | Second | Third | Second | Third | | |
| Power (dBm) | Harmonic (dBc) | Harmonic (dBc) | Harmonic (dBc) | Harmonic (dBc) | Second Harmonic | Third Harmonic |
| 23 | −45 | −23 | −31 | −22 | 14 | 1 |
| 24 | −46 | −23 | −32 | −22 | 14 | 1 |
| 25 | −47 | −24 | −31 | −22 | 16 | 2 |

The data in Table A demonstrates potential harmonics improvement at an antenna interface in a radio frequency (RF) device. The table shows that with impedance control as described herein, device breakdown may begin at a higher power level than in a system/device not implementing impedance control. For example, in the non-impedance-controlled configuration, substantial drop-off in performance (e.g., RSE) may occur past 19 dBm power levels, whereas the harmonics for systems/devices implementing impedance control at much higher power levels (e.g., 25 dBm) may be better than the 20 dBm performance for the non-controlled device/system. The data presented in Table A may correspond to the power of a single FET transistor; systems/devices disclosed herein may include a plurality of FETs combined in series.

Examples of Implementations in Products:

Various examples of FET-based switch circuits and bias/coupling configurations described herein can be implemented in a number of different ways and at different product levels. Some of such product implementations are described by way of examples.

Semiconductor Die Implementation

Figure 14A:
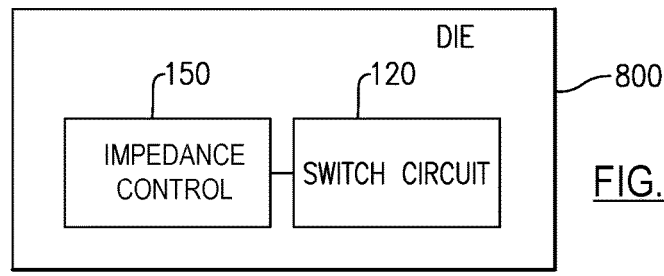
FIGS. 14A-14D are block diagrams of dies having a switch circuit and impedance control circuitry according to one or more embodiments.
Figure 14B:
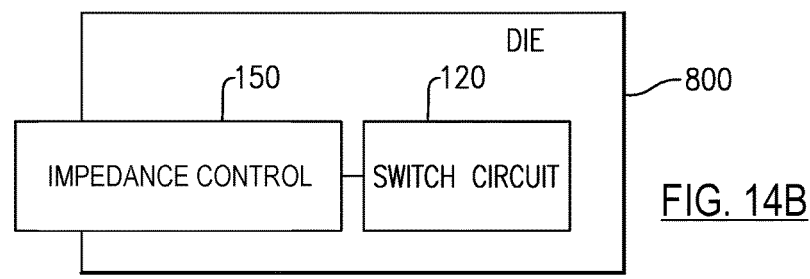

FIGS. 14A-14D schematically show non-limiting examples of such implementations on one or more semiconductor die. FIG. 14A shows that in some embodiments, a switch circuit 120 and an impedance control network 150 having one or more features as described herein can be implemented on a die 800. FIG. 14B shows that in some embodiments, at least some of the impedance control network 150 can be implemented outside of the die 800 of FIG. 14A.

Figure 14C:
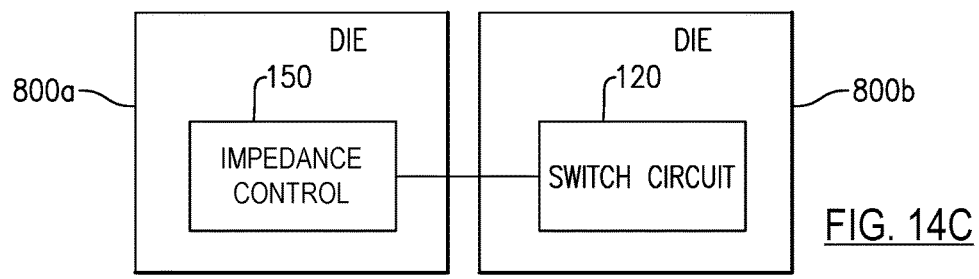
Figure 14D:
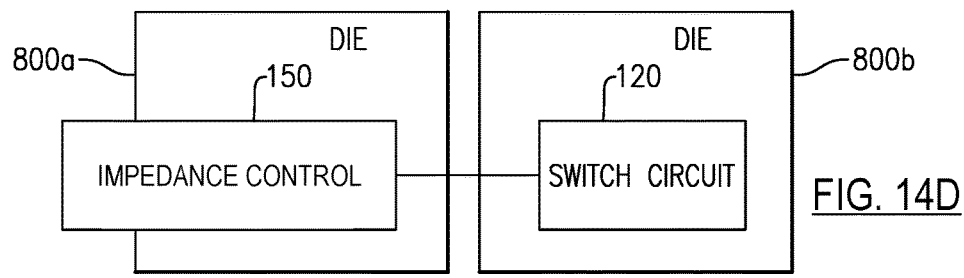

FIG. 14C shows that in some embodiments, a switch circuit 120 having one or more features as described herein can be implemented on a first die 800a, and an impedance control network 150 having one or more features as described herein can be implemented on a second die 800b. FIG. 14D shows that in some embodiments, at least some of the impedance control network 150 can be implemented outside of the first die 800a of FIG. 14C.

Packaged Module Implementation

Figure 15A:
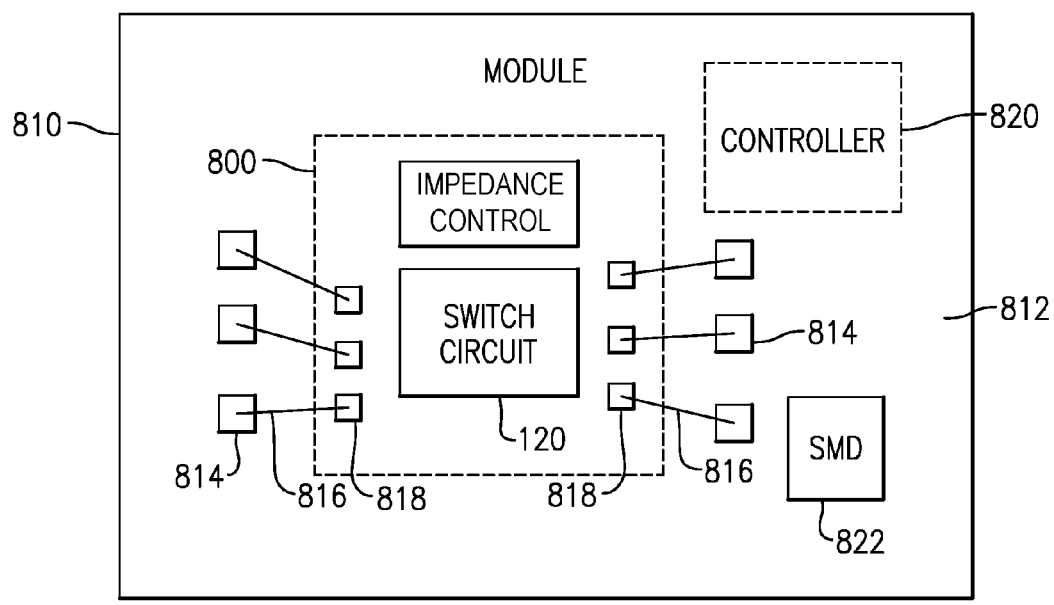
FIGS. 15A and 15B illustrate a plan view and a side view, respectively, of a radio-frequency module in accordance with one or more embodiments.

In some embodiments, one or more die having one or more features described herein can be implemented in a packaged module. An example of such a module is shown in FIGS. 15A (plan view) and 15B (side view). Although described in the context of both of the switch circuit and the impedance control network being on the same die (e.g., example configuration of FIG. 15A), it will be understood that packaged modules can be based on other configurations.

A module 810 is shown to include a packaging substrate 812. Such a packaging substrate can be configured to receive a plurality of components, and can include, for example, a laminate substrate. The components mounted on the packaging substrate 812 can include one or more dies. In the example shown, a die 800 having a switching circuit 120 and an impedance control network 150 is shown to be mounted on the packaging substrate 812. The die 800 can be electrically connected to other parts of the module (and with each other where more than one die is utilized) through connections such as connection-wirebonds 816. Such connection-wirebonds can be formed between contact pads 818 formed on the die 800 and contact pads 814 formed on the packaging substrate 812. In some embodiments, one or more surface mounted devices (SMDs) 822 can be mounted on the packaging substrate 812 to facilitate various functionalities of the module 810.

In some embodiments, the packaging substrate 812 can include electrical connection paths for interconnecting the various components with each other and/or with contact pads for external connections. For example, a connection path 832 is depicted as interconnecting the example SMD 822 and the die 800. In another example, a connection path 832 is depicted as interconnecting the SMD 822 with an external-connection contact pad 834. In yet another example a connection path 832 is depicted as interconnecting the die 800 with ground-connection contact pads 836.

In some embodiments, a space above the packaging substrate 812 and the various components mounted thereon can be filled with an overmold structure 830. Such an overmold structure can provide a number of desirable functionalities, including protection for the components and wirebonds from external elements, and easier handling of the packaged module 810.

Figure 15B:
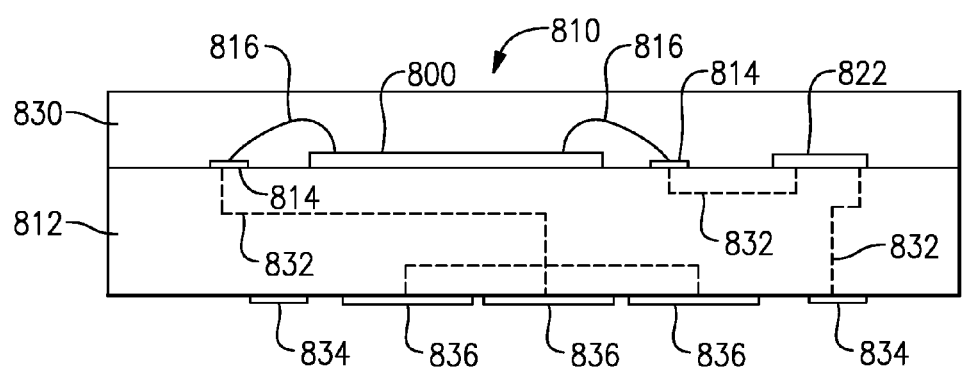
Figure 16:
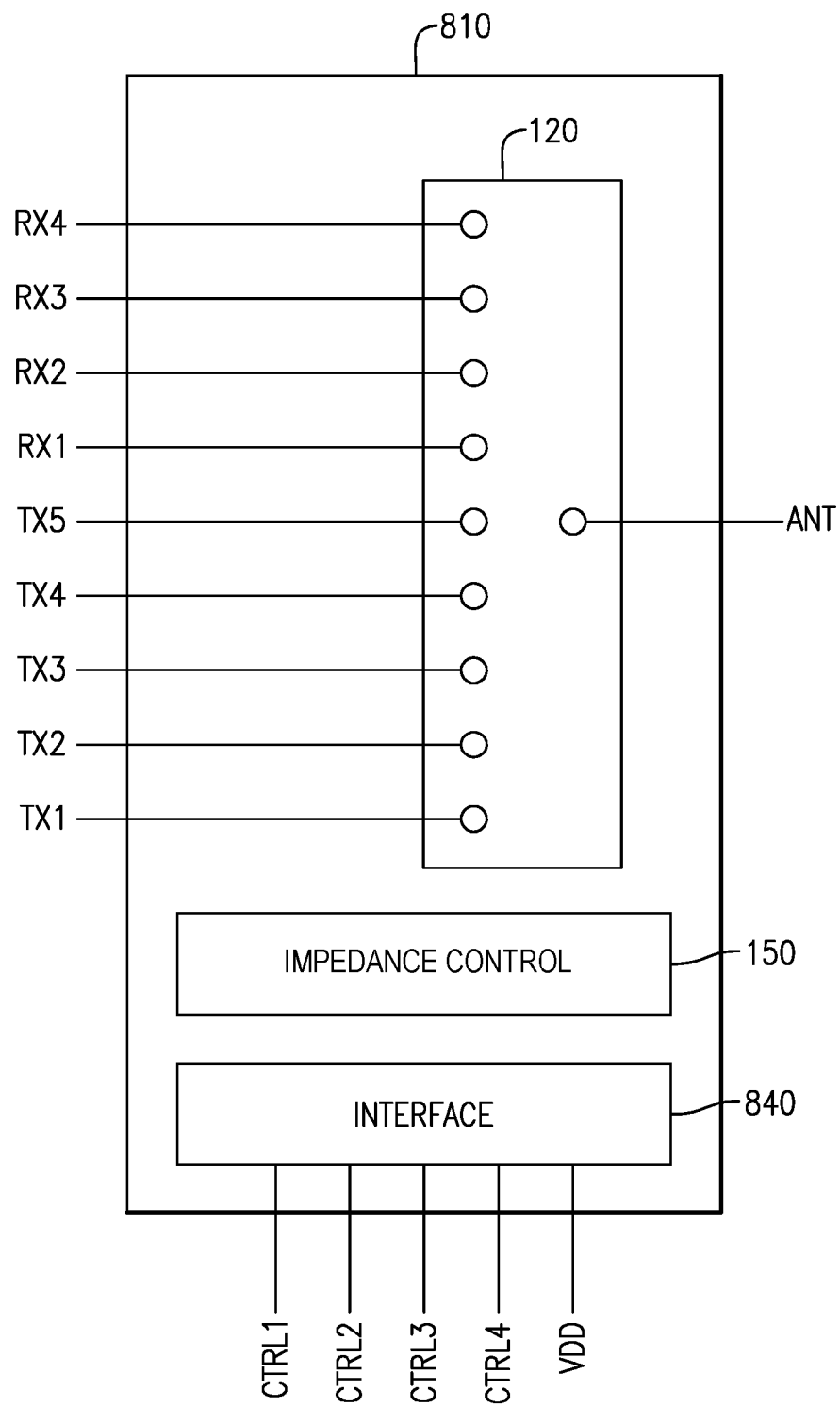
FIG. 16 shows a schematic diagram of an example switching configuration that can be implemented in a radio-frequency module according to one or more embodiments.

FIG. 16 shows a schematic diagram of an example switching configuration that can be implemented in the module 810 described in reference to FIGS. 15A and 15B. In the example, the switch circuit 120 is depicted as being an SP9T switch, with the pole being connectable to an antenna and the throws being connectable to various Rx and Tx paths. Such a configuration can facilitate, for example, multi-mode multi-band operations in wireless devices.

The module 810 can further include an interface for receiving power (e.g., supply voltage VDD) and control signals to facilitate operation of the switch circuit 120 and/or the impedance control network 150. In some implementations, supply voltage and control signals can be applied to the switch circuit 120 via the impedance control network 150.

Wireless Device Implementation

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 17:
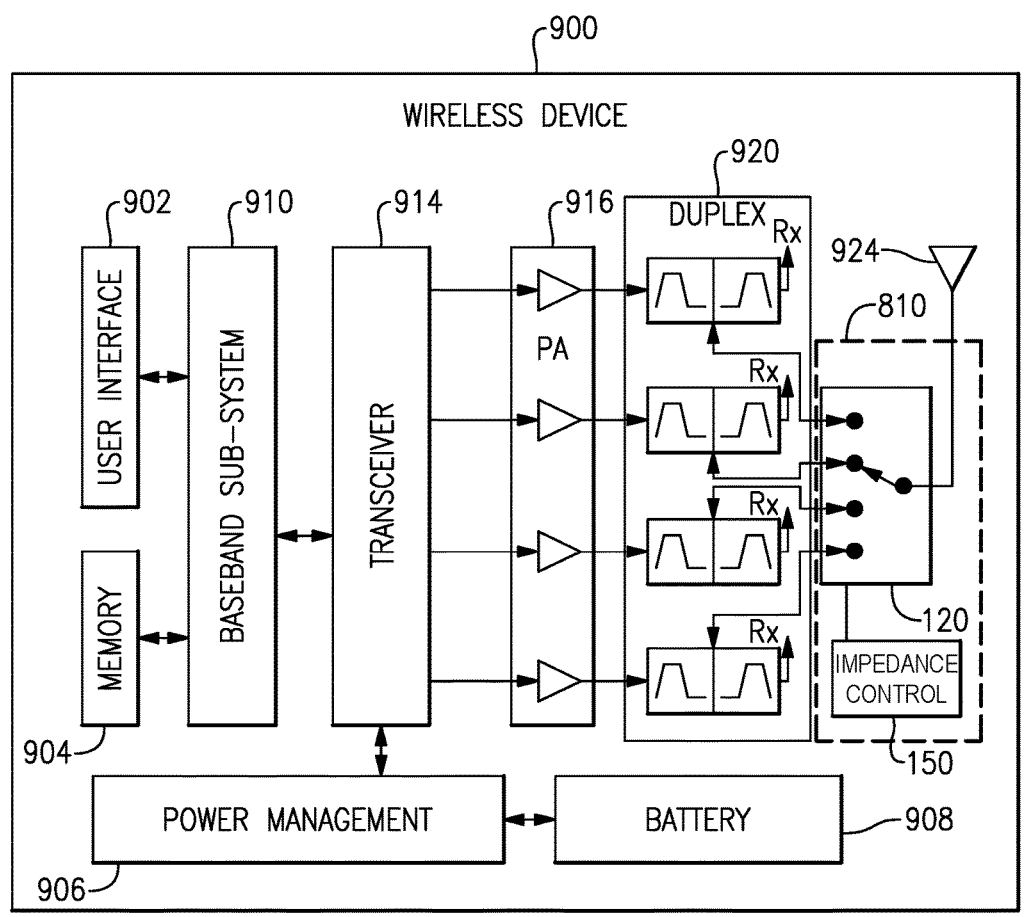
FIG. 17 is a block diagram of an example wireless device according to one or more embodiments.

FIG. 17 schematically depicts an example wireless device 900 having one or more advantageous features described herein. In the context of various switches and various biasing/coupling configurations as described herein, a switch 120 and an impedance control network 150 can be part of a module 810. In some embodiments, such a switch module can facilitate, for example, multi-band multi-mode operation of the wireless device 900.

In the example wireless device 900, a power amplifier (PA) module 916 having a plurality of PAs can provide an amplified RF signal to the switch 120 (via a duplexer 920), and the switch 120 can route the amplified RF signal to an antenna. The PA module 916 can receive an unamplified RF signal from a transceiver 914 that can be configured and operated in known manners. The transceiver can also be configured to process received signals. The transceiver 914 is shown to interact with a baseband sub-system 910 that is configured to provide conversion between data and/or voice signals suitable for a user and RF signals suitable for the transceiver 914. The transceiver 914 is also shown to be connected to a power management component 906 that is configured to manage power for the operation of the wireless device 900. Such a power management component can also control operations of the baseband sub-system 910 and the module 810.

The baseband sub-system 910 is shown to be connected to a user interface 902 to facilitate various input and output of voice and/or data provided to and received from the user. The baseband sub-system 910 can also be connected to a memory 904 that is configured to store data and/or instructions to facilitate the operation of the wireless device, and/or to provide storage of information for the user.

In some embodiments, the duplexer 920 can allow transmit and receive operations to be performed simultaneously using a common antenna (e.g., 924). In FIG. 16, received signals are shown to be routed to "Rx" paths (not shown) that can include, for example, a low-noise amplifier (LNA).

The switch may have impedance control circuitry 150 associated therewith according to one or more embodiments disclosed herein. A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

General Comments:

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A radio-frequency switch comprising:
a first field-effect transistor disposed between a first node and a second node, the first field-effect transistor having a source, a drain, a gate, and a body;
a coupling path connected between the body of the first field-effect transistor and the gate of the first field-effect transistor, the coupling path including a diode; and
an adjustable impedance network connected between the body of the first field-effect transistor and a ground reference, the adjustable impedance network being configured to reduce radio-frequency distortion in the first field-effect transistor.

2. The radio-frequency switch of claim 1 wherein the adjustable impedance network is configured to present a first impedance when the first field-effect transistor is transmitting a signal having a first frequency and present a second impedance when the first field-effect transistor is transmitting a signal having a second frequency higher than the first frequency.

3. The radio-frequency switch of claim 1 wherein the first field-effect transistor is a silicon-on-insulator field-effect transistor.

4. The radio-frequency switch of claim 1 wherein the adjustable impedance network includes a second field-effect transistor having a gate, a drain, and a source.

5. The radio-frequency switch of claim 4 wherein the second field-effect transistor is connected at one of the drain or source of the second field-effect transistor to the body of the first field-effect transistor and connected at the other of the drain or the source of the second field-effect transistor to the ground reference.

6. The radio-frequency switch of claim 4 wherein the second field-effect transistor is operable to provide a desired impedance for reducing undesired radio-frequency distortion in the first field-effect transistor at a frequency of operation.

7. The radio-frequency switch of claim 4 wherein the adjustable impedance network includes one or more resistors connected in series with the second field-effect transistor.

8. The radio-frequency switch of claim 4 wherein the adjustable impedance network includes one or more capacitors connected in series with the second field-effect transistor.

9. The radio-frequency switch of claim 1 wherein the adjustable impedance network includes a capacitor.

10. The radio-frequency switch of claim 9 wherein the capacitor is connected at a first end to the body of the first field-effect transistor and at a second end to the ground reference.

11. The radio-frequency switch of claim 1 wherein the adjustable impedance network includes a capacitor connected in series with an inductor.

12. The radio-frequency switch of claim 1 wherein the adjustable impedance network includes a plurality of capacitors configured to be selectively coupled to the body of the first field-effect transistor using a network of switches.

13. A radio-frequency switch module comprising:
a packaging substrate configured to receive a plurality of components;
a semiconductor die mounted on the packaging substrate, the semiconductor die including a first field-effect transistor having a gate, a drain, a source, and a body;
a coupling path connected between the body of the first field-effect transistor and one of the source, the drain, and the gate of the first field-effect transistor, the coupling path including a diode; and
an impedance control circuit connected between the body of the first field-effect transistor and a ground reference, the impedance control circuit being configured to reduce radio-frequency distortion in the first field-effect transistor.

14. The radio-frequency switch module of claim 13 wherein the impedance control circuit includes a second field-effect transistor having a gate, a drain, and a source.

15. The radio-frequency switch module of claim 14 wherein the second field-effect transistor is connected at one of the drain or source of the second field-effect transistor to the body of the first field-effect transistor.

16. The radio-frequency switch module of claim 13 wherein the impedance control circuit includes a capacitor connected to the body of the first field effect transistor.

17. The radio-frequency switch module of claim 13 wherein the impedance control circuit includes a capacitor connected in series with an inductor.

* * * * *